United States Patent
Amiotti et al.

(10) Patent No.: US 6,762,446 B2
(45) Date of Patent: Jul. 13, 2004

(54) INTEGRATED CAPACITIVE DEVICE WITH HYDROGEN DEGRADABLE DIELECTRIC LAYER PROTECTED BY GETTER LAYER

(75) Inventors: Marco Amiotti, Vigevano (IT); Jae Hak Jung, San Luis Obispo, CA (US); Claudio Boffito, Rho (IT)

(73) Assignee: Saes Getters S.p.A., Lainate (IT)

( * ) Notice: Subject to any disclaimer, the term of this patent is extended or adjusted under 35 U.S.C. 154(b) by 0 days.

(21) Appl. No.: 10/353,159

(22) Filed: Jan. 27, 2003

(65) Prior Publication Data

US 2003/0136989 A1 Jul. 24, 2003

Related U.S. Application Data

(63) Continuation of application No. PCT/IT01/00399, filed on Jul. 25, 2001.

(30) Foreign Application Priority Data

Jul. 28, 2000 (IT) ..................................... MI2000A1753

(51) Int. Cl.[7] .......................... H01L 29/76; H01L 29/94; H01L 31/062; H01L 31/113; H01L 27/108
(52) U.S. Cl. .......................... 257/296; 257/295
(58) Field of Search .......................... 257/295, 296, 257/310

(56) References Cited

U.S. PATENT DOCUMENTS

| | | | | |
|---|---|---|---|---|
| 5,481,490 A | * | 1/1996 | Watanabe et al. | 365/145 |
| 5,523,595 A | * | 6/1996 | Takenaka et al. | 257/295 |
| 5,591,663 A | * | 1/1997 | Nasu et al. | 438/3 |
| 5,716,875 A | * | 2/1998 | Jones et al. | 438/3 |
| 5,760,433 A | * | 6/1998 | Ramer et al. | 257/295 |
| 5,909,043 A | | 6/1999 | Summerfelt | |
| 5,990,513 A | * | 11/1999 | Perino et al. | 257/315 |
| 6,066,868 A | * | 5/2000 | Evans, Jr. | 257/295 |
| 6,130,103 A | * | 10/2000 | Cuchiaro et al. | 438/3 |
| 6,225,656 B1 | * | 5/2001 | Cuchiaro et al. | 257/295 |
| 6,512,256 B1 | * | 1/2003 | Cuchiaro et al. | 257/295 |
| 6,570,202 B2 | * | 5/2003 | Cuchiaro et al. | 257/295 |

FOREIGN PATENT DOCUMENTS

| | | |
|---|---|---|
| EP | 0 605 980 A2 | 7/1994 |
| EP | 0 837 505 A1 | 4/1998 |
| EP | 0 911 871 A2 | 4/1999 |
| EP | 0 951 059 A2 | 10/1999 |
| EP | 0 954 019 A2 | 11/1999 |
| JP | 10199454 A | 7/1998 |
| JP | 11008355 A | 1/1999 |
| JP | 11040761 A | 2/1999 |
| JP | 11087633 A | 3/1999 |
| JP | 11293089 A | 10/1999 |
| JP | 2000040799 A | 2/2000 |

* cited by examiner

*Primary Examiner*—Ngân V. Ngô
(74) *Attorney, Agent, or Firm*—Akin Gump Strauss Hauer & Feld L.L.P.

(57) ABSTRACT

An integrated capacitive device has a thin-film capacitor formed of first and second electrode layers, electrically separated by a dielectric layer formed of a hydrogen-degradable compound. To protect the dielectric layer from degradation due to hydrogen diffusion, at least one layer of a getter material is provided, selected from alloys of zirconium, vanadium and iron, optionally containing minor quantities of manganese and/or a rare earth group element, and alloys of zirconium with at least one metal of the group of iron, cobalt and nickel, optionally containing up to about 15% by weight of elements of the rare earth group.

13 Claims, 3 Drawing Sheets

THIN-FILM CAPACITOR

CAPACITOR

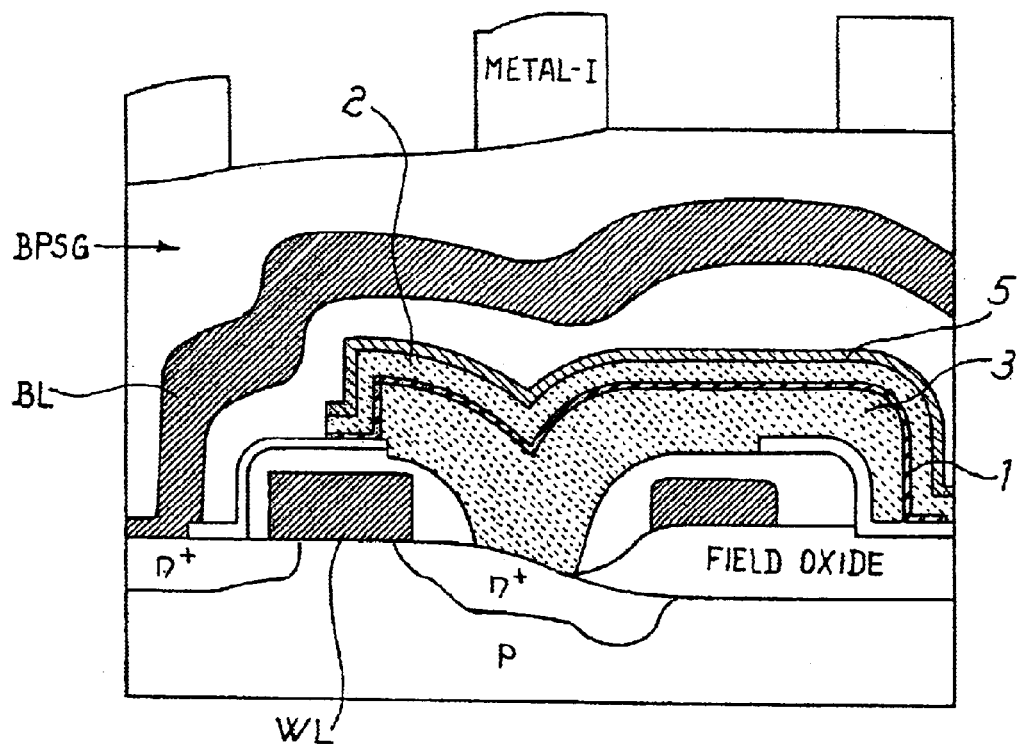

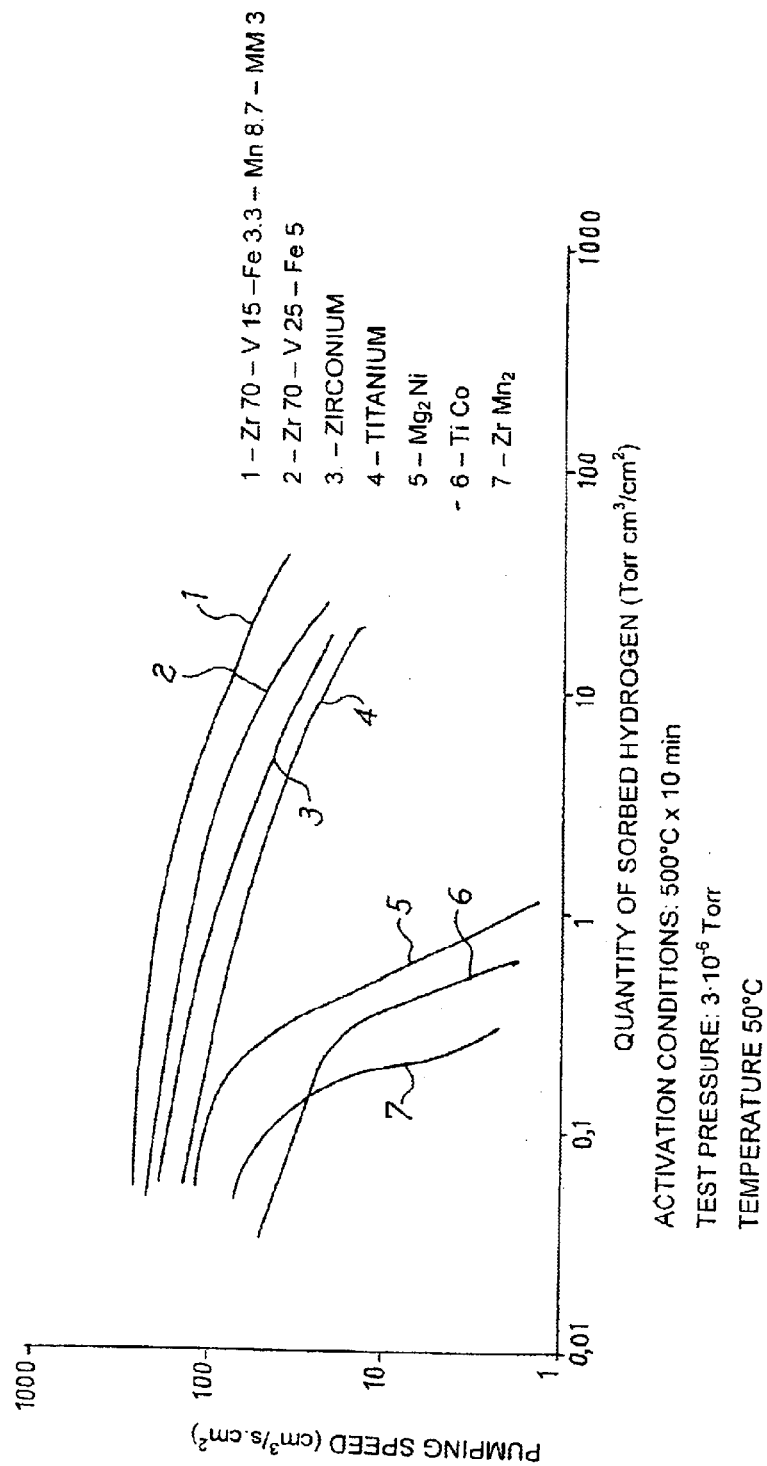

INTEGRATED CAPACITIVE DEVICE WITH HYDROGEN DEGRADABLE DIELECTRIC LAYER PROTECTED BY GETTER LAYER

CROSS-REFERENCE TO RELATED APPLICATIONS

This application is a continuation of International Patent Application No. PCT/IT01/00399, filed Jul. 25, 2001, which was published in the English language on Feb. 7, 2002, under International Publication No. WO 02/11192, and the disclosure of which is incorporated herein by reference.

BACKGROUND OF THE INVENTION

The present invention relates in general to integrated circuits and in particular to storage devices whose structure comprises a dielectric layer of capacitive coupling having ferroelectric features and/or a high dielectric constant, both in the case that the storage device employs the features of residual polarization of the ferroelectric oxide or the capacitive coupling through the dielectric oxide for storing information in the form of electric charge.

Ferroelectric and particularly dielectric compounds based on mixed oxides or equivalent compounds with ferroelectric features are materials used in different fields and particularly in the manufacture of integrated structures on a semiconductor or dielectric substrate. Piezoelectric filters, ultrasonic transducers which employ the piezoelectric features, infrared transducers, optical sensors employing features of pyroelectricity, optical modulation devices, and optical diaphragms based on the employment of electro-optical features are some applications of these materials.

The possibility of manufacturing extremely thin dielectric films of materials having ferroelectric features has favored the development of nonvolatile storage devices with ferroelectric capacitors, which employ the stability in time of the residual polarization of the thin layer of ferroelectric material of the capacitor. These devices (storage cells) have been developed by virtue of their potential to be manufactured in extremely compact size, so as to increase the storage capacity and the level of integration of the whole integrated device or their marked ability to preserve the information even in particularly hard conditions.

Ferroelectric dielectrics which are commonly used in the manufacturing processes of integrated devices are lead zirconate titanates, $PbZr_{(1-x)}Ti_{(x)}O_3$, commonly known with the acronym PZT, bismuth and strontium tantalate or $Sr_2Bi_2Ta_2O_9$, commonly known with the acronym SBT or YI, and the lanthanum and bismuth titanates, commonly known with the acronym BLT. These are among the most used materials for manufacturing the so-called FeRAM storage devices.

Another similar dielectric material (also with ferroelectric features) used as a dielectric layer, in particular as dielectric interpoly of capacitive coupling between a control gate structure (wordline) and the floating gate of the cell in DRAM cell structures, is barium and strontium titanate, $Ba_{(x)}Sr_{(1-x)}TiO_3$, also known with the acronym BST.

The materials preferably used for exploiting the ferroelectric features thereof in FeRAM are the above mentioned PZT and also the SBT or the BLT, whereas the BST is most frequently used in the DRAMs by virtue of an increased possibility of depositing extremely thin films thereof, having a high dielectric constant, free from defects.

The techniques of deposition of the layers of dielectric compounds with ferroelectric features can be various, such as by "sputtering", or by chemical deposition from the vapor phase (CVD) wherein a decomposable compound, commonly an organometallic compound of precursor metals, is deposited from the vapor phase on a suitable substrate.

Another method of formation of these layers is the so-called "sol-gel" method, wherein a solution of precursor compounds is used in order to form a film on substrate, commonly by thermal decomposition of several applications of sol-gel. There is also a method based on the creation of a "mist" of ionized drops of a solution of a metallo-organic precursor compound, which are deposited on the wafers. Once the solvent is evaporated, the metallo-organic compound is decomposed at high temperature in a strongly oxidizing environment, so as to form a film of composite oxide. This technique is known in the literature as "Liquid Source Misted Chemical Deposition" or briefly LSMCD. Other methods of preparation are known in the literature.

Leaving out of consideration the particular function of the thin-film capacitor of dielectric material with high dielectric constant, optionally also with marked ferroelectric features, and the relevant integrated structure to which it belongs, whether that of a FeRAM, of a DRAM or other, the formation of the thin-film capacitor in the course of a manufacturing process of a common semiconductor integrated device, for example in CMOS technology, entails a number of problems due to a precise risk of exposure of the thin layer, generally based on oxides, to hydrogen. As a matter of fact, in the common course of a manufacturing process of integrated devices, there are a number of operations where hydrogen is present that remains partly trapped or incorporated in the wafer during the manufacture, typically in the semiconductor silicon substrate.

For example in a CMOS process, the devices (transistors) defined in the active areas can be exposed to an annealing treatment in hydrogen atmosphere for neutralizing bonds which are left "dangling" in the semiconductor, in order to reduce problems of superficial charge at the interface between the semiconductor and the gate oxide. During this annealing treatment, hydrogen can remain trapped in the substrate, which thus becomes a source of hydrogen diffusion during the working life of the integrated device. Other sources of exposure to hydrogen can be identified in the so-called "back-end" steps of the process, during the formation of metallizing aluminum layers, the steps of formation of tungsten plugs for the contacts and formation of the IDL layers, wherein the process conditions are such that the presence of hydrogen is implicated.

Hydrogen can also be present during the sealing and encapsulating steps of the integrated device, in the case of ceramic "packaging." Also, during the working life of the devices, a certain diffusion of hydrogen inside the device can take place.

The effects of degradation of a dielectric film, optionally with ferroelectric features, generally formed of an oxide or more frequently of mixed oxides or equivalent compounds, upon exposure to hydrogen are well-known and discussed in the literature. In particular, a hydrogen degradation of the ferroelectric film of an FeRAM causes a contraction of the hysteresis curve, thus reducing the separation between the logical values 1 and 0 on the ordinate axis, which effect can bring about a difficulty in the discrimination criteria in the reading step of the information stored in the ferroelectric film capacitor. In the case of a DRAM, the degradation of the thin dielectric film of interpoly capacitive coupling determines a loss of electric charge stored in the floating gate through the wordline.

The suggestions made until now in order to overcome this critical aspect of the dielectric and ferroelectric materials having a high dielectric constant against a hardly avoidable hydrogen exposure have been several.

European published patent application EP-A-0 605 980 discloses a growth PECVD technique of a $Si_3N_4$ and SiON layer having a low hydrogen content, as an inter-dielectric state of an FeRAM device, using TEOS ($Si(OC_2H_5)_4$) and $N_2$, instead of the common mixture of $SiH_4/NH_3/N_2$.

U.S. Pat. No. 5,523,595 discloses the sputtering of a TiN or TiON layer on the FeRAM device using a PZT deposited via sol-gel, with functions of a barrier-layer against hydrogen and humidity.

U.S. Pat. No. 5,481,490 discloses the deposition of a thin layer of nitride of aluminum, silicon or titanium on the ferroelectric capacitor, in order to prevent the degradation of the ferroelectric film of the capacitor during the annealing treatments which are foreseen in the manufacturing process of the device, during which the gases $H_2$ and $N_2$ are used.

U.S. Pat. No. 5,591,663 discloses a particular sequence of a manufacturing process of an FeRAM device using conventional materials, which avoids the hydrogen degradation during the annealing treatment.

European published patent application EP-A-0 837 505 discloses a structure comprising a ferroelectric capacitor, wherein a second layer of ferroelectric material PZT is deposited on the already defined structure of the ferroelectric capacitor, so that the second layer of PZT acts as a sacrificial layer, thus preventing hydrogen from reaching and degrading the PZT layer of the capacitor.

European published patent application EP-A-0 911 871 discloses the formation of a thin layer of tantalum and silicon nitride on the ferroelectric capacitor structure, with the function of a barrier layer against the possible diffusion of hydrogen against the ferroelectric layer of the capacitor.

U.S. Pat. No. 5,760,433 discloses the use of a sacrificial layer of a material chemically reactive towards hydrogen which is arranged on the capacitor structure as a protection of the ferroelectric layer of the capacitor. The sacrificial material can contain Sr, Nb, Ta and/or Bi, bismuth oxide, palladium oxide.

U.S. Pat. No. 5,716,875 discloses an FeRAM structure wherein, after annealing in $N_2+H_2$, a layer of silicon nitride $Si_3N_4$ is deposited on the integrated structure of the transistor and on the back of the substrate wafer for encapsulating (isolating) the structure and preventing in the future the possible effects due to hydrogen retention after the annealing treatment. On a structure so "isolated" with regards to the diffusion of the hydrogen therein sorbed, there is formed the ferroelectric capacitor, which can be therefore advantageously annealed in an oxygen atmosphere without causing degradation of the transistor features. On the other hand, the hydrogen possibly trapped in the so "insulated" wafer structure will not be able to reach and to degrade the ferroelectric film of the capacitor, thanks to the barrier offered by the nitride layer.

European published patent application EP-A-0 951 059 discloses a particular manufacturing process wherein a final annealing in oxygen would solve the hydrogen degradation which could have taken place during the metallization processes.

U.S. Pat. No. 5,990,513 describes the formation of an inter-level dielectric layer with hydrophilic properties covered by a dielectric layer having reduced hydrophilic properties for protecting the ferroelectric layer during the annealing treatment in hydrogen atmosphere in the case of a ceramic encapsulated device. Ceramic encapsulation requires generally an annealing process at 440 □.

Japanese published patent application JP-11-293089 describes the formulation of an epoxy resin usable for encapsulating an FeRAM device having features of low hydrogen release at 175 □ for 90 minutes.

Japanese published patent application JP-11-087633 discloses the use in an FeRAM device of a metal layer formed of a material capable of storing hydrogen during the manufacturing steps. Then, the sorbed hydrogen is expelled by means of thermal treatment under vacuum. The used material can be Pd, V, Ni, Nb, Ti, Fe, Mg, $TiFeLaNi_2$, $Ti_2Mn_3$ VNb, TiCo, $ZrMn_2$, $Mg_2Cu$, $Mg_2Ni$, $LaCo_3$, $Ti_2V_8$, $Ti_2C$, $Ti_2Fe$, $Ti_2CoMn$.

Japanese published patent application JP-1140761 discloses the use of a layer of Ta or V or Nb deposited on the ferroelectric capacitor for protecting the latter from hydrogen degradation.

Japanese published patent application JP-118355 discloses the use of a hydrogen barrier layer formed of titanium dioxide or silicon nitride arranged under the lower electrode of the ferroelectric capacitor and of a barrier layer arranged over the upper electrode of the ferroelectric capacitor of the same materials or alternatively of titanium nitride or of TiOSi.

Japanese published patent application JP-2000-40799 discloses that, by making a reactive layer of Pb—Pt—Ti—O between the PZT ferroelectric layer and the Pt upper electrode of a ferroelectric capacitor, it is possible to prevent the diffusion of hydrogen towards the dielectric and often ferroelectric film of the capacitor.

Until today, the most commonly followed approach is interposing a barrier layer against the diffusion of hydrogen as a protection of the preformed structure of the thin-film capacitor. Obviously, the barrier layer is effective only against the hydrogen coming "from above", that is, the hydrogen which is present in the back-end steps of the manufacturing process of the integrated device. However, the barrier layer is not effective against a possible diffusion of hydrogen "from below", that is, from the hydrogen which has been trapped in the wafer during the annealing treatment and hydrogen of the active structures, which have been formed before making the capacitor. Some known solutions entail the formation of a barrier layer against the diffusion of hydrogen even under the lower electrode of the thin-layer capacitor.

In most of the suggested solutions the approach is anyway protecting the thin layer of dielectric and/or ferroelectric material of the capacitor by means of barrier layers which insulate it against a possible hydrogen diffusion.

The barrier layers tend to stop hydrogen diffusion toward the electrodes and therefore toward the dielectric and/or ferroelectric or having a high dielectric constant material in a passive way. In the case for example of oxides, in addition to the passive effect there is also the chemical reaction between hydrogen and oxide which produces water. This reaction eliminates hydrogen, producing the hydrogen compound.

Also, the materials disclosed in the further Japanese published patent application JP-11-087633 for retaining hydrogen, which is then removed by thermally treating the device under vacuum before the final encapsulation thereof, are capable of sorbing hydrogen in a significant way only at atmospheric pressure.

BRIEF SUMMARY OF THE INVENTION

The main object of the present invention is to provide a thin-film capacitor structure, wherein the dielectric is formed of a material having a high dielectric constant and optionally having also ferroelectric features, protected from the risk of degradation of the dielectric material due to hydrogen diffusion in a more effective way than it is obtainable with the known techniques and without the above mentioned drawbacks and limitations.

This important result is obtained by providing, under the lower electrode and over the upper electrode of the thin-film capacitor, a layer of getter material which is capable of sorbing and retaining hydrogen even at sub-atmospheric pressures without giving rise to chemical bonds (reacting) with hydrogen and/or to morphological modifications of the material.

The sorbing action exerted toward hydrogen by the getter material, in addition to sequestering the hydrogen remaining in the finished device, retains it, thus avoiding degradation of the dielectric-ferroelectric film, without giving rise to generation of water and without chemically reacting with hydrogen.

However, in order to obtain this result, it is necessary that the getter material have hydrogen equilibrium pressures less than 1 mbar at room temperature and that the thickness sufficient for retaining the hydrogen present is compatible with the stringent requirements of compactness of the integrated structures.

Basically, the getter material is an alloy made of zirconium, vanadium and iron, optionally containing minor quantities selected from manganese and the group of rare earth elements, or an alloy of zirconium and at least one of the metals of the group consisting of iron, cobalt, nickel, and optionally containing up to about 15% by weight of rare earth elements.

One layer of getter material is deposited over the layer of material forming the upper electrode of the capacitor and, more preferably, also under the layer forming the lower electrode of the thin-film capacitor, optionally deposited on a first layer of adhesion, for example titanium, interposed between the laminated structure of the capacitor and the support layer.

The getter layer provided under the lower electrode of the thin-film capacitor intercepts the hydrogen which may diffuse from the substrate, if it has been sorbed by the substrate during a previous step of annealing of the wafer in hydrogen. Typically, the lower getter layer can have a lesser thickness (of the order of about 50–100 nm) than the upper getter layer, which can have a thickness also up to about 200 nm.

The lower getter layer can effectively also contribute to sensibly increase the adhesion between an electrode layer, for example of a noble metal or alloy of a noble metal, and the underlying support layer, often in an FeRAM or DRAM device, an amorphous layer of silicon oxide doped with boron and phosphorous (BPSG). In many cases, it can provide the necessary adhesion, thus avoiding the need to interpose a specific adhesion layer with the support layer.

The getter layer which is provided over the upper electrode of the ferroelectric capacitor intercepts and traps the hydrogen which can diffuse through the insulating, metallizing and passivating layers, commonly placed over the defined structure of the ferroelectric thin-film capacitor during the subsequent steps of the fabrication process of the integrated device, in some cases also including the encapsulating steps of the device (packaging).

Both the getter layer formed over the upper electrode of the capacitor and the getter layer optionally formed under (deposited before) the lower electrode of the capacitor can be defined through appropriate masking and attacking steps together with other layers of the structure. In particular, the upper getter layer can result in being self-aligned to the perimeter of definition of the capacitor. Alternatively, the getter layer can be defined through a suitable masking step, also with a wider perimeter than the perimeter of the capacitive coupling area.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings, embodiments which are presently preferred. It should be understood, however, that the invention is not limited to the precise arrangements and instrumentalities shown. In the drawings:

FIG. 3 is a schematic cross-sectional view of a DRAM storage memory made according to the present invention.

FIG. 4 is a graph of hydrogen sorption features of two different materials of the invention as a function of the quantity of sorbed gas at room temperature, as well as the corresponding curves measured on three barrier materials according to the prior art and on the pure metals zirconium and titanium.

DETAILED DESCRIPTION OF THE INVENTION

Figure 1:
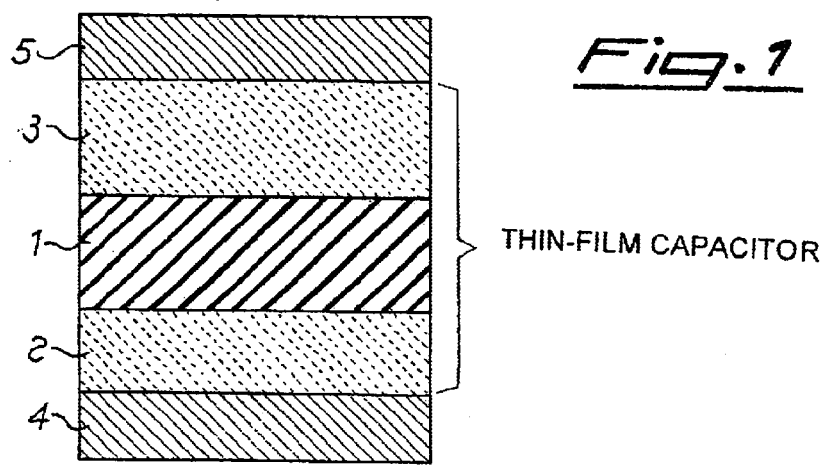
FIG. 1 is a schematic cross-sectional view of a structure of a thin-film capacitor according to the invention.

FIG. 1 shows in a schematic way the cross-section of a thin-film capacitor structure with dielectric layer 1 of an oxide having a high dielectric constant and ferroelectric features, comprising an upper getter material layer and a lower getter material layer, made according to the present invention. Dielectric layer 1 having ferroelectric properties of the capacitor can be of a material of the group of PZT, SBT, BST, BLT, as above described, or equivalent.

The material forming both upper 3 and lower 2 electrodes of the ferroelectric capacitor, can be a material of the group of platinum, iridium, rhodium, ruthenium, silver or gold; alloys of the same metals with themselves or with other non-noble metals; conductive oxides containing at least one noble metal (particularly iridium, rhodium or ruthenium) or lead, mixed oxides (particularly non-stoichiometric mixed oxides) of a noble metal (particularly iridium, rhodium and/or ruthenium) and a metal such as titanium, tantalum, zirconium and mixtures of the same metals; polysilicon and polysilicon doped with boron, phosphorous or arsenic; and equivalent electrically conductive materials.

Lower getter layer 4 and upper getter layer 5 are made of a material of the group consisting of the alloys of zirconium, vanadium and iron, optionally containing minor quantities of manganese and/or the group of rare earth elements, or alloys of zirconium with at least one of the metals of the group consisting of iron, cobalt, nickel, and optionally containing up to about 15% by weight from the group of the rare earth elements.

In particular, alloys based on zirconium, vanadium or iron are exceptionally effective in sorbing and trapping hydrogen, even at sub-atmospheric pressures, such as those which are normally present during crucial treatment steps in the presence of hydrogen of the common CMOS manufacturing processes. Another feature of the above mentioned alloys is a higher capacity of retaining hydrogen at relatively high temperature, when other types of metal materials would show a marked release of the sorbed hydrogen.

A possible sequence of a process for manufacturing the multi-layer thin-film capacitor of FIG. 1 comprises:

forming an insulating support layer of the capacitor;

depositing getter material 4 by any technique selected among the physical deposition techniques such as sputtering, laser ablation, cathodic arch, and evaporation, or chemical deposition techniques such as MOCVD or LSMCD by starting in the two latter cases from a metallo-organic precursor compound containing the getter metal or metals;

depositing the material of lower electrode 2 by sputtering;

depositing the dielectric material, optionally with ferroelectric features or high dielectric constant, by means of sputtering or sol-gel or MOCVD or LSMCD, starting in the two latter cases from metallo-organic precursor compounds containing the metal or the metals of the ferroelectric material;

depositing the material of the upper electrode 3 by sputtering;

depositing getter material 5 by any technique selected among the physical deposition techniques such as sputtering, laser ablation, cathodic arch, and evaporation, or chemical deposition techniques such as MOCVD or LSMCD by starting in the two latter cases from a metallo-organic precursor compound containing the getter metal or metals.

The thickness of the dielectric layer 1 of ferroelectric or high dielectric constant material is generally of the order of or less than about 200 nm, while the total thickness of the two layers 2–4 and 3–5 of electrode material and getter material is also generally less than about 200 nm. The layers of getter material 4 and 5 can have a thickness of about 150 nm. The lower getter layer 4 can have a reduced thickness with respect to the upper layer 5.

The definition of the thin-film capacitor and of the getter layer or layers can be carried out according to the common masking and attacking techniques. In particular, while the lower getter layer 4 can be defined together with the lower electrode, on which it can be necessary to establish a contact or a way of interconnection, the upper getter layer 5 can be defined together with the upper electrode layer 3 and the dielectric layer 1 of the capacitor by means of a single masking and attacking step. Alternatively, the upper layer of getter material 5, deposited on a predefined structure of a capacitor, can also be defined in turn by means of a masking and attacking step with a wider perimeter than the perimeter of the underlying capacitor structure.

Figure 2:
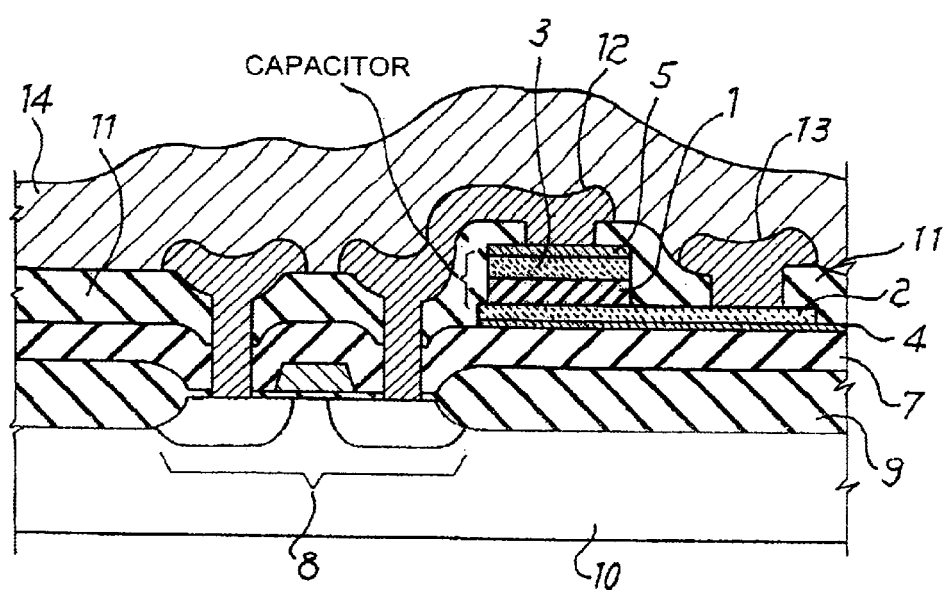
FIG. 2 is a schematic cross-sectional view of an FeRAM storage cell made according to the present invention.

FIG. 2 is a classical representation of the cross-section of an FeRAM storage cell, the ferroelectric capacitor of which is made according to the present invention. The support layer 7, on which the ferroelectric thin-film capacitor structure is formed, is typically an insulating dielectric layer 7 of the structure of the MOS transistor, indicated as a whole with 8 in FIG. 2, made in the active area defined by the field oxide 9 grown on the semiconductor substrate 10. Support layer 7 is commonly formed of silicon oxide (for example a glass doped with boron and phosphorous deposited by chemical deposition from the vapor phase).

On support layer 7 is deposited the bottom getter material 4 and subsequently a layer 2 of an electrode material, which are defined by a first masking and attacking step. Then, the material of the dielectric and ferroelectric film 1 is deposited, followed by the deposition of the upper electrode layer 3 and of the upper getter layer 5.

The so formed stack is then defined by means of a further masking and attacking step, thus defining the thin-film capacitor between the two getter layers 4 and 5 or protection against possible hydrogen diffusion toward the layer 1.

When the definition of the structure of the ferroelectric capacitor is completed, a second insulating layer 11 is commonly deposited, through which the upper portions of the contacts of the transistors and the interconnection ways 12 and 13 of the ferroelectric thin-film capacitor associated with the transistor respectively contact the upper getter layer 5 and the lower electrode layer 2.

Then, the first level metallization layer (metal I, see FIG. 3) is deposited, which is subsequently defined by masking and attacking.

The cross-section illustrated in FIG. 2 also shows the carried out deposition of a third insulating layer 14.

Because of the exceptional dielectric features and of the possibility of being formed (deposited) in the form of films having a thickness which may even be extremely reduced ($\leq 10$ nm) lacking defects, similar dielectric materials sensible to degradation phenomena in the presence of hydrogen are commonly used also for applications where their high dielectric constant is used, independently of their optional ferroelectric feature which may be more or less marked.

A typical field of use of these materials is for forming the interpoly dielectric thin film which separates the two levels of polysilicon (poly), thus forming the storage capacitor of information in the form of electric charge of a DRAM storage cell.

According to the most recent techniques, the DRAM cells can maintain a classical configuration of the "stack" type, that is with the thin-film capacitor formed on the semiconductor substrate or of the "trench" type, where the structure is partially made in a previously produced groove of the semiconductor substrate.

FIG. 3 shows a modern DRAM structure where the storage capacitor of the electric charge is made by capacitive coupling through a thin dielectric film 1 interposed between electrodes 2 and 3 respectively defined in poly 3 and poly 2.

For protection of the thus-formed structure from possible hydrogen diffusion present in a number of subsequent steps of the manufacturing process of the storage device, over the upper electrode layer 2 defined of poly 3 is deposited a getter layer 5 according to the invention which, by encapsulating completely the structure of the DRAM capacitor, protects against possible degradation of the dielectric features of the thin-film 1 of capacitive coupling, capturing and blocking hydrogen and preventing it from reaching and going through the conductive electrode layer 2 of poly 3 and thus reaching the thin dielectric layer 1 of capacitive coupling. The getter layer 5 can have a thickness between about 20 and 100 nm.

The features of dynamic hydrogen sorption of the two preferred getter materials of the invention used for forming the layers of protection from hydrogen (curves 1 and 2) are compared in FIG. 4 with those of pure metals such as zirconium and titanium (curves 3 and 4) and with those of barrier materials (curves 5, 6 and 7) described in the above mentioned prior art patent publications. The composition relating to curve 1 comprises 3% of MM, which is an abbreviation for the so-called "misch metal" material, which is a mixture of rare earths of variable composition.

As can be easily noted from FIG. 4, the getter layers according to the invention which intercept and block the hydrogen have, differently from the known materials, a dynamic sorption capacity and a volumetric sorption capacity which are compatible with the stringent requirement of compactness and, more particularly, of maximum tolerable thickness values of the most advanced manufacturing processes for storage devices.

It will be appreciated by those skilled in the art that changes could be made to the embodiments described above without departing from the broad inventive concept thereof. It is understood, therefore, that this invention is not limited to the particular embodiments disclosed, but is intended to cover modifications within the spirit and scope of the present invention as defined by the appended claims.

We claim:

1. An integrated capacitive device comprising a thin-film capacitor formed of upper and lower electrode layers electrically separated by a dielectric layer, the dielectric layer comprising a hydrogen-degradable compound, a protective layer above the upper electrode layer of the capacitor, and an intermediate dielectric layer covering the capacitor and the protective layer, wherein the protective layer comprises a first layer of getter material selected from the group consisting of (a) alloys of zirconium, vanadium and iron, optionally containing minor quantities selected from the group consisting of manganese and the group of rare earth elements, and (b) alloys of zirconium with at least one metal selected from the group consisting of iron, cobalt and nickel, optionally containing up to about 15% by weight of rare earth elements.

2. The device according to claim 1, further comprising a support for the capacitor, a metal adhesion layer between the support and the lower electrode layer of the capacitor, and a second layer of getter material on an upper face of the support.

3. The device according to claim 2, wherein the second layer of getter material also acts as an adhesion layer between the support and the lower electrode layer.

4. The device according to claim 2, wherein of the second layer of getter material has a thickness not greater than about 100 nm.

5. The device according to claim 1, wherein the first layer getter material has a thickness not greater than about 200 nm.

6. The device according to claim 1, wherein the electrode layers of the capacitor comprise a material selected from the group consisting of platinum, iridium, rhodium, ruthenium, silver, and gold metals; alloys of these metals; conductive oxides of iridium, rhodium, ruthenium and/or lead; non-stoichiometric mixed oxides of iridium, ruthenium and/or rhodium with at least another metal selected from the group consisting of Ti, Ta and Zr; polysilicon; and polysilicon doped with an element selected from the group consisting of boron, phosphorous and arsenic.

7. A ferroelectric storage device comprising a semiconductor substrate, an MOS transistor formed in the substrate and having an integrated structure with at least one insulating layer, and at least one ferroelectric thin-film capacitor functionally connected to a current terminal of the MOS transistor and formed above the at least one insulating layer, wherein the capacitor comprises a lower electrode layer, a ferroelectric oxide layer and an upper electrode layer, and wherein a first layer of getter material is provided over the upper electrode layer, the getter material being selected from the group consisting of (a) alloys of zirconium, vanadium and iron, optionally containing minor quantities selected from the group consisting of manganese and the group of rare earth elements, and (b) alloys of zirconium with at least one metal selected from the group consisting of iron, cobalt and nickel, optionally containing up to about 15% by weight of rare earth elements.

8. The device according to claim 7, further comprising a second layer of getter material on an upper face of the at least one insulating layer.

9. The device according to claim 8, wherein the second layer of getter material acts as an adhesion layer between the at least one insulating layer and the lower electrode layer.

10. The device according to claim 8, wherein the second layer of getter material has a thickness not greater than about 100 nm.

11. The device according to claim 7, wherein the first layer of getter material has a thickness not higher than about 200 nm.

12. The device according to claim 7, wherein the electrode layers of the capacitor comprise a material selected from the group consisting of platinum, iridium, rhodium, ruthenium, silver, and gold metals; alloys of these metals; conductive oxides of iridium, rhodium, ruthenium and/or lead; non-stoichiometric mixed oxides of iridium, ruthenium and/or rhodium with at least another metal selected from the group consisting of Ti, Ta and Zr.

13. A DRAM device comprising a semiconductive substrate, an MOS transistor formed in the substrate, and a thin-film capacitor for storing information in a form of electric charges, the capacitor being associated to the transistor and comprising electrodes made of polysilicon at two levels and coupled through a dielectric film, wherein a layer of getter material is provided over at least an area of capacitive coupling of the electrodes, the getter material being selected from the group consisting of (a) alloys of zirconium, vanadium and iron, optionally containing minor quantities selected from the group consisting of manganese and the group of rare earth elements, and (b) alloys of zirconium with at least one metal selected from the group consisting of iron, cobalt and nickel, optionally containing up to about 15% by weight of rare earth elements.

* * * * *